(12) United States Patent
Chang et al.

(10) Patent No.: US 8,029,890 B2
(45) Date of Patent: Oct. 4, 2011

(54) STRUCTURE OF THERMAL RESISTIVE LAYER AND THE METHOD OF FORMING THE SAME

(75) Inventors: Jung-Fang Chang, Tainan County (TW); Te-Chi Wong, Tainan County (TW); Chien-Te Hsieh, Taichung County (TW); Chin-Jen Huang, Kaohsiung (TW); Yu-Hung Chen, Taoyuan County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 63 days.

(21) Appl. No.: 12/630,204

(22) Filed: Dec. 3, 2009

(65) Prior Publication Data
US 2010/0080977 A1    Apr. 1, 2010

Related U.S. Application Data

(62) Division of application No. 11/023,569, filed on Dec. 29, 2004, now abandoned.

(30) Foreign Application Priority Data

Nov. 4, 2004 (TW) ............................... 93133566 A (51) Int. Cl.
*B32B 3/26* (2006.01)
(52) U.S. Cl. ............... 428/312.6; 428/312.8; 428/313.9; 428/314.2; 428/319.1; 428/457; 428/469; 428/699; 428/701; 428/702

(58) Field of Classification Search .................. None
See application file for complete search history.

(56) References Cited

U.S. PATENT DOCUMENTS

| | | | |
|---|---|---|---|
| 6,399,117 B1 | 6/2002 | Hoff et al. | |
| 6,399,177 B1 | 6/2002 | Fonash et al. | |
| 6,733,907 B2 | 5/2004 | Morrison et al. | |
| 6,861,668 B2 | 3/2005 | Yeh | |
| 7,112,846 B2 | 9/2006 | Wolfe et al. | |
| 2004/0005258 A1* | 1/2004 | Fonash et al. | 422/271 |
| 2004/0132235 A1 | 7/2004 | Dahmani et al. | |
| 2006/0032329 A1 | 2/2006 | Rubinstein et al. | |
| 2006/0284218 A1 | 12/2006 | Kaner et al. | |
| 2007/0001220 A1 | 1/2007 | Tombler et al. | |
| 2007/0254154 A1 | 11/2007 | Wong et al. | |

FOREIGN PATENT DOCUMENTS

| | | |
|---|---|---|
| CN | 1171295 | 1/1998 |
| CN | 1770437 | 5/2006 |

* cited by examiner

*Primary Examiner* — Ling Xu
(74) *Attorney, Agent, or Firm* — WPAT, PC; Justin King (57) ABSTRACT

The prevent invention discloses a structure of thermal resistive layer and the method of forming the same. The thermal resistive structures, formed on a plastic substrate, comprises a porous layer, formed on said plastic substrate, including a plurality of oxides of hollow structure, and a buffer layer, formed on said porous layer, wherein said porous layer can protect said plastic substrate from damage caused by the heat generated during manufacturing process. With the structure and method disclosed above, making a thin film transistor and forming electronic devices on the plastic substrate in the technology of Low Temperature PolySilicon, i.e. LTPS, without changing any parameters is easy to carry out.

12 Claims, 9 Drawing Sheets

FIB. 2C

FIG.6F ative layer and the method of forming the same. More particularly, the invention relates to utilize a plurality of oxides of hollow structure to form a thermal resistive layer on a plastic substrate to prevent the substrate from damage caused by the heat generated during manufacturing process.

STRUCTURE OF THERMAL RESISTIVE LAYER AND THE METHOD OF FORMING THE SAME

CROSS REFERENCE TO RELATED PATENT APPLICATION

This application is a divisional application of U.S. patent application Ser. No. 11/023,569 filed on Dec. 29, 2004, which claims the foreign priority of Taiwanese patent application 93133566 filed on Nov. 4, 2004.

FIELD OF THE INVENTION

The present invention relates to a structure of thermal resistive layer and the method of forming the same. More particularly, the invention relates to utilize a plurality of oxides of hollow structure to form a thermal resistive layer on a plastic substrate to prevent the substrate from damage caused by the heat generated during manufacturing process.

BACKGROUND OF THE INVENTION

There are two important aspects while developing the future flat display, one is how to manufacture a flexible, light, and thin display panel, and the other is how to manufacture electronic elements with higher electrons mobility and higher response speed for display panel. But the conventional flat displays are using the glass material as base substrates, which is superior in large area manufacturing and mass production; however, the feature of light, thin and flexible is difficult to be put into practice for glass substrate, therefore, undoubtedly, there is no better way to overcome the drawback above unless find an appropriate material. As to the other aspect, Low Temperature PolySilicon, i.e. LTPS technology, can achieve the objective; therefore, the thin film transistors formed by process of LTPS gradually becomes the main stream to be substituted for the process forming amorphous thin film transistors.

Among the materials nominated for the purpose to make a flexible, light, and thin display, plastic substrate is substantially win the engineers' gaze, nevertheless, the plastic substrate can't withstand the damage caused by heat generated during the manufacturing process in LTPS manufacturing process. This is because, during such process, a laser annealing with processing temperature more than 600-Celsius degree, which is almost higher than the glass transition temperature of plastic substrate, is necessary to be utilized to transform the amorphous silicon into poly-crystalline silicon.

Although plastic substrates are not capable of bearing such high temperature, overall speaking, compared with other materials, the plastic substrates still have many merits that engineers can't give up; therefore, there are still many efforts that scientists and engineers dedicate to overcome such as U.S. Pat. No. 5,817,550 and U.S. Pat. No. 6,680,485. In the U.S. Pat. No. 5,817,550, it disclosed a method utilizing a low energy laser, which is to form poly-crystalline silicon on a plastic substrate. In such method, at first, a silicon dioxide is formed on a plastic substrate, and then an amorphous layer was deposited on said silicon dioxide layer. Subsequently, a short-pulse XeCl Excimer Laser (308 nm) is used to transform said amorphous silicon layer into poly-crystalline silicon in no more than 100 ns. Another U.S. Pat. No. 6,680,485 discloses a method utilizing a low energy laser to form poly-crystalline silicon on a low-temperature plastic substrate, wherein a specific thickness around 0.1 to 5.0 micrometer of silicon dioxide is formed, and then a specific thickness around 10 to 500 nanometer is formed on said silicon dioxide layer. Subsequently, a short-pulse XeCl Excimer Laser (308 nm) is used to transform said amorphous silicon layer into poly-crystalline silicon with processing temperature no more than 250-Celsius degree.

Summarizing the prior arts described above, a list of drawbacks was concluded as following:
(1) The grain size of poly-crystalline silicon will be affected by lower the energy of laser and shorten the annealing time, and then characteristics of elements formed on plastic substrate will be further influenced.
(2) The prior arts disclose a step to form a silicon dioxide on the plastic substrate; however, forming silicon dioxide is time-consuming so that throughput of mass production will be affected. For example, it will spend 30 minutes to 40 minutes forming 4-micrometer silicon dioxide layer.
(3) Meanwhile, although the better isolation can be achieved by thicker oxidized layer, the brittle characteristic of the thicker oxidized layer can also leads to easy chapping and easy fragile that result in difficulty to control the manufacturing process.

Hence, it is necessary to develop a structure of thermal resistive layer for plastic substrate and manufacturing method thereof to overcome the drawbacks of the prior arts.

SUMMARY OF THE INVENTION

The main object of the present invention is to provide a structure of thermal resistive layer and the method of forming the same, utilizing oxides of hollow structure to form a thermal resistive layer on a plastic substrate, to increase the capability of heatproof, so as to achieve the objective of forming PolySilicon thin film on the plastic substrate.

A further object of the present invention is to provide a structure of thermal resistive layer and the method of forming the same, utilizing oxides of hollow structure formed on a plastic substrate, so as to achieve the objective of making thin film transistor flat display with characteristics of tiny, light, thin and flexible.

Another object of the present invention is to provide a structure of thermal resistive layer and the method of forming the same, making high efficiency electronic elements, so as to lower manufacturing cost.

Another further object of the present invention is to provide a structure of thermal resistive layer and the method of forming the same, a porous layer is formed to smooth the surface of the plastic substrate.

For the purpose to achieve the objectives listed above, the prevent invention discloses a structure of thermal resistive layer, formed on a plastic substrate, comprises a porous layer, formed on said plastic substrate, including a plurality of oxides of hollow structure, and a buffer layer, formed on said porous layer, wherein said porous layer can protect said plastic substrate from damage caused by the heat generated during manufacturing process. With the structure and method disclosed above, making a thin film transistor and forming electronic elements on the plastic substrate in the technology of Low Temperature PolySilicon, i.e. LTPS, without changing any parameters is easy to carry out.

For the purpose to achieve the objectives listed above, the prevent invention discloses a method for forming a structure of thermal resistive layer on a plastic substrate comprising the steps of:
  forming a plurality of oxides of hollow structure on an anodized template;
  removing said anodized template;

forming a porous layer by coating said plurality of oxides of hollow structure on said plastic substrate; and forming a buffer layer on said porous layer.

On the other hand, for the purpose to achieve the objectives listed above, the prevent invention discloses another method for forming a structure of thermal resistive layer on a plastic substrate comprising the steps of:

forming a material layer on said plastic substrate;

transforming said material layer into a porous template layer with a specific thickness by anodizing; and forming a buffer layer on said porous template layer.

BRIEF DESCRIPTION OF THE DRAWINGS

The drawings, incorporated into and form a part of the disclosure, illustrate the embodiments and method related to this invention and will assist in explaining the detail of the invention.

FIG. 2C is a schematic view illustrating the column shape of oxide of hollow structure.

DESCRIPTION OF THE PREFERRED EMBODIMENT

Figure 1A:
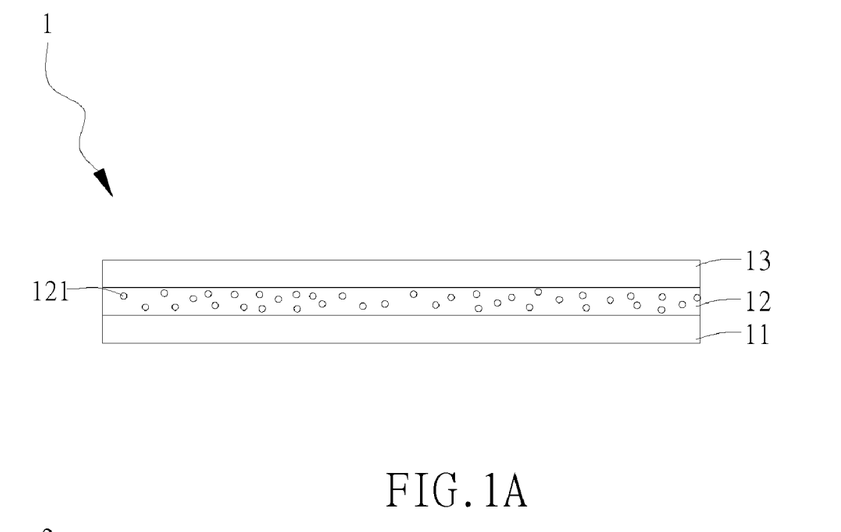
FIG. 1A is a cross-section view illustrating a preferred embodiment according to the principle of the invention.
Figure 2A:
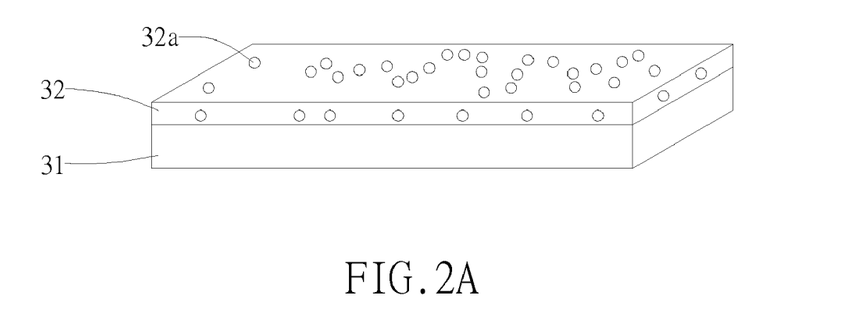
FIG. 2A is a schematic view illustrating the sphere shape of oxide of hollow structure.
Figure 2B:
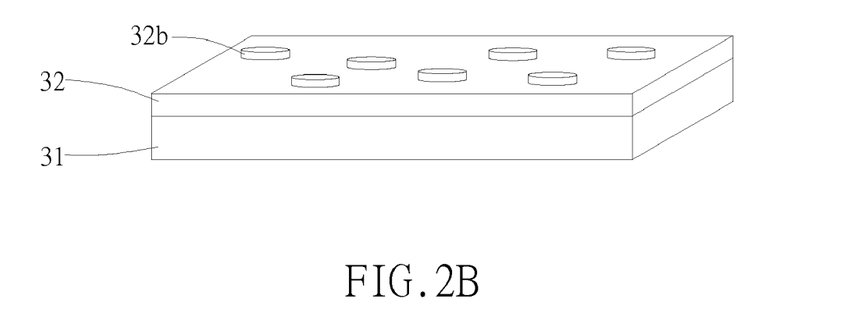
FIG. 2B is a schematic view illustrating the disk shape of oxide of hollow structure.

Referring to FIG. 1A, the figure is a cross-section view illustrating a preferred embodiment according to the principle of the invention. The prevent invention discloses a structure of thermal resistive layer 1 comprising a plastic substrate 11, a porous layer 12, including a plurality of oxides of hollow structure 121, and a buffer layer 13, which is silicon dioxide in this embodiment. The oxides of hollow structure 121 are materials selected from a group consisting of silicon oxide, titanium oxide, zinc oxide, and aluminum oxide and the shape of said oxides of hollow structure 121 are structures selected from a group consisting of sphere 32a, as illustrated in FIG. 2A, disk 32b, as illustrated in FIG. 2B, column 32c, as illustrated in FIG. 2C, wherein distribution of said column shape 32c of said oxides of hollow structure 121 can be selected from a group consisting of standing and lying flat on said plastic substrate. By means of utilizing said porous layer 12, the damage, caused by heat generated from manufacturing process, to said plastic substrate 11 can be prevented.

Figure 1B:
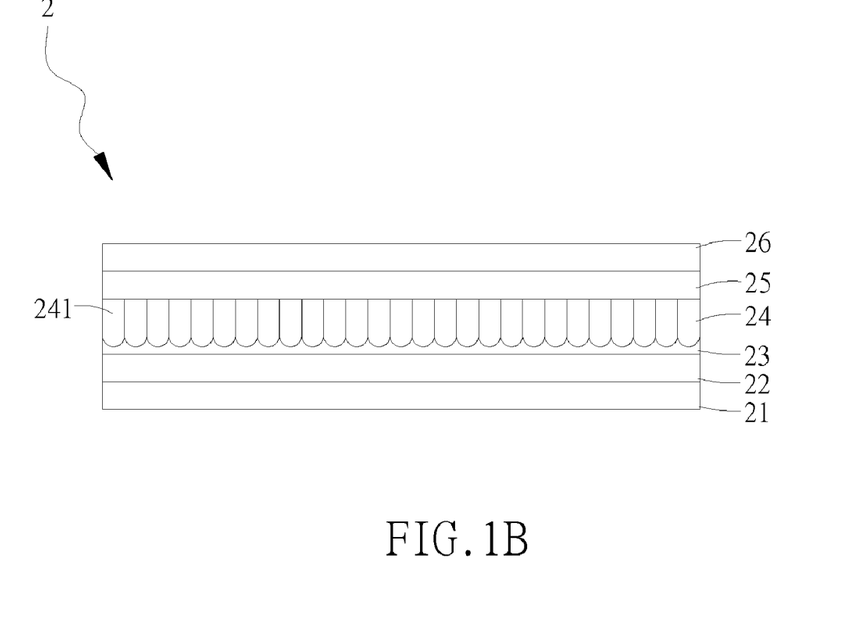
FIG. 1B is a cross-section view illustrating another preferred embodiment according to the principle of the invention.

Please continuing to refer to FIG. 1B, the figure is a cross-section view illustrating another preferred embodiment according the principle of the invention. The embodiment according to this invention discloses a structure of thermal resistive layer 2 comprising a plastic substrate 21, a conductive layer 22, substantially a material of indium tin oxide (ITO) in this embodiment to increase uniformity of a porous layer 24 that will be mentioned later, formed on said plastic substrate 21, a template layer 23, a material selected from a group consisting of silicon, titanium, zinc and aluminum, formed on said conductive layer 22, a porous layer 24, including a plurality of oxides of hollow structure 241 and being selected from a group consisting of silicon oxide, zinc oxide, titanium oxide, and aluminum oxide, formed on said template layer 23, a planarization layer 25, formed on said porous layer 24 so as to smooth the surface of said porous layer 24, and a buffer layer 26, substantially a material of silicon dioxide, formed on said planarization layer 25, which is a material selected from the group consisting of polymer, and inorganic materials.

From the content described above, it is easy to understand the structure of thermal resistive layer according to the present invention. In the following description, the manufacturing method to form said structure is disclosed in detail.

Figure 3A:
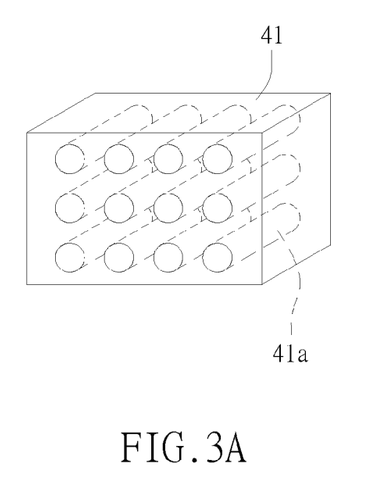
FIG. 3A through FIG. 3D are cross-section views illustrating the forming flow of a preferred embodiment according to the principle of the invention.
Figure 3B:
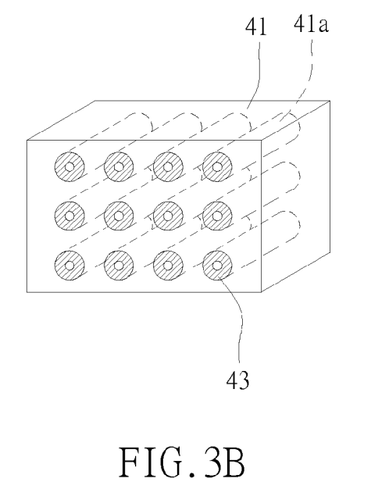
Figures 3C, 3D:
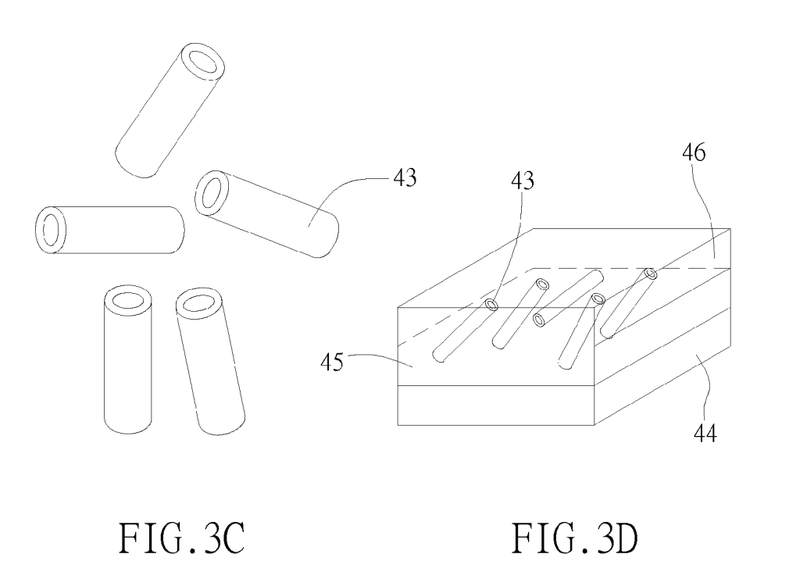

Please referring to the FIG. 3A through FIG. 3D, the figures are cross-section views illustrating the forming flow of a preferred embodiment according to the principle of the invention. The process, forming a structure of thermal resistive layer, comprising the following steps starting from the step shown in FIG. 3A, an anodized template 41 including a plurality of mold holes 41a is provided, wherein said anodized template is a material selected from the group consisting of silicon, titanium, zinc and aluminum. Then the process continues to the step shown in FIG. 3B, wherein a plurality of oxides of hollow structure 43 are formed in said plurality of mold holes 41a of said anodized template 41 through the process of electrochemistry, chemical vapor deposition (CVD), or sol-gel. Said oxide of hollow structure is a material selected from the group consisting of silicon oxide, titanium oxide, zinc oxide, and aluminum oxide and the shape of said oxide of hollow structure is selected from the group consisting of sphere, column, and disk. Afterwards, said anodized template 41 is removed, as shown in FIG. 3C, by etching. The process continues to the step shown in FIG. 3D, wherein said oxides of hollow structure 43 are processed by sol-gel and then are coated on said plastic substrate 44 by spin coating to form a porous layer 45. Finally, a buffer layer 46 is formed on said porous layer 45, wherein said buffer layer is substantially a silicon oxide.

Figure 4A:
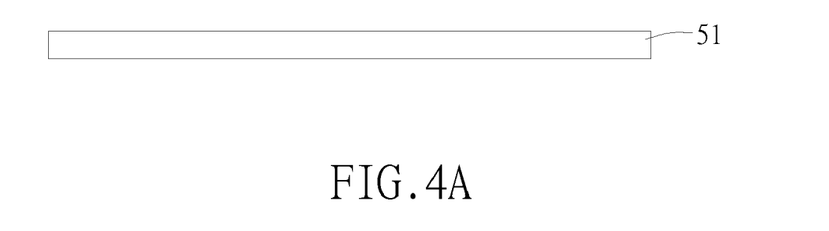
FIG. 4A to FIG. 4F are cross-section views illustrating the forming flow of another preferred embodiment according to the principle of the invention.
Figure 4B:
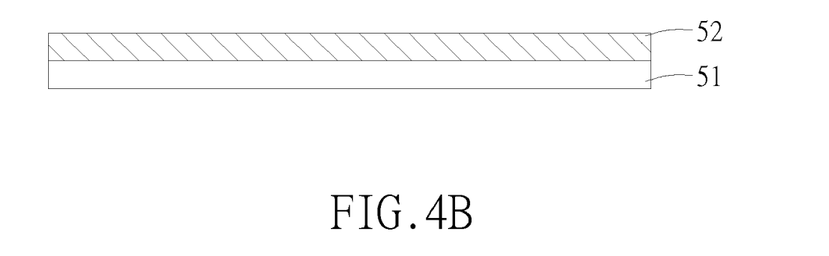
Figure 4C:
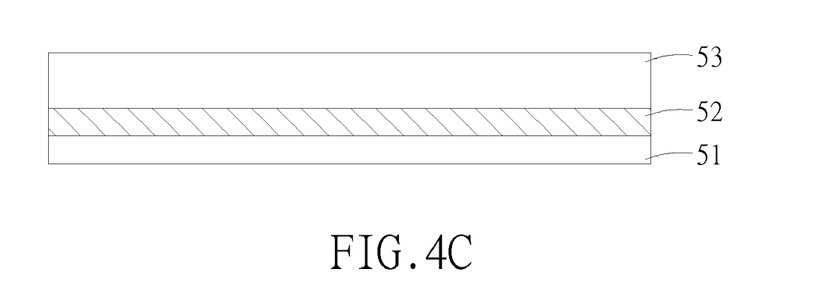
Figure 4D:
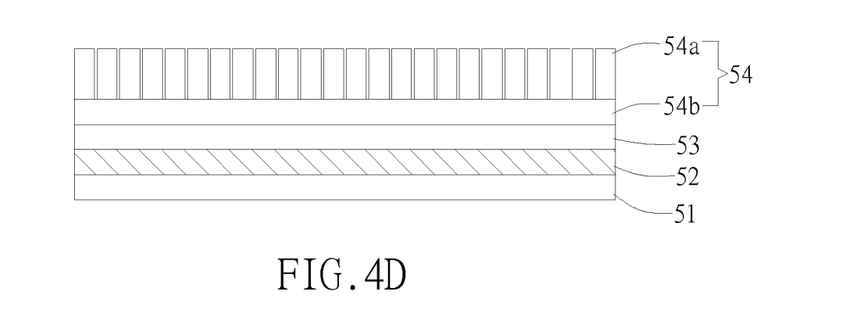
Figure 4E:
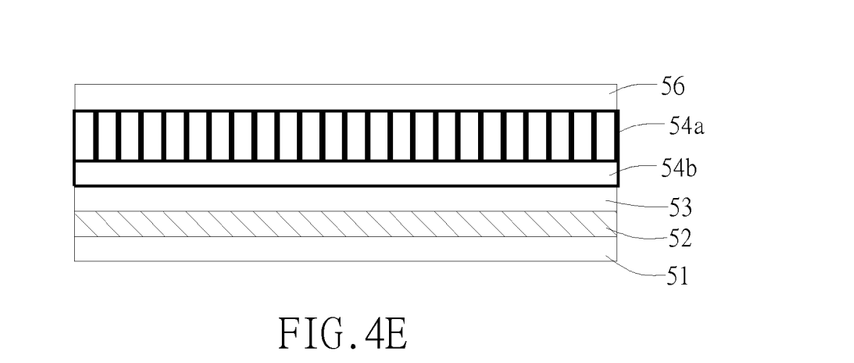
Figure 4F:
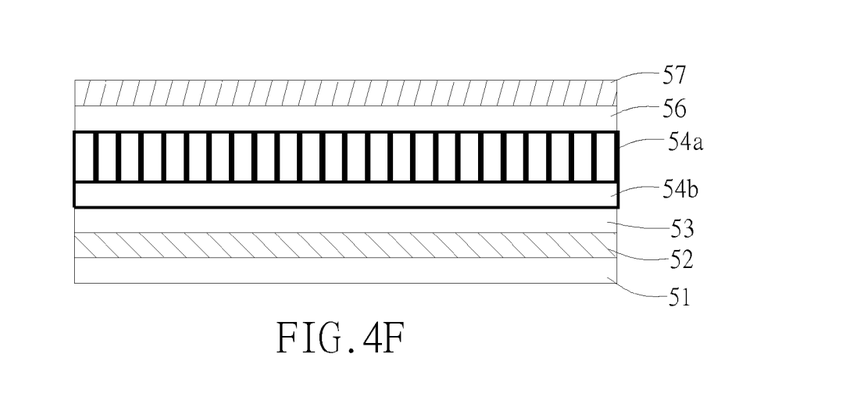

Please referring to the FIG. 4A through FIG. 4F, the figures are cross-section views illustrating the forming flow of another preferred embodiment according to the principle of the invention. For more detail, the process, forming a structure of thermal resistive layer, is illustrated and explained in the following description. The process starts from providing a plastic substrate 51, shown in FIG. 4A, then, as shown in FIG. 4B, a conductive layer 52 formed on said plastic substrate 51 is implemented. In this embodiment, said conductive layer 52 is substantially a material of indium tin oxide (ITO). The process proceeds to the step shown in FIG. 4C, wherein a material layer 53 is formed on said conductive layer 52. Said material layer 53 is a material selected from the group consisting of silicon, titanium, zinc, and aluminum; thereafter, as shown in FIG. 4D, said material layer 53 is transformed into a porous template layer 54 with a plurality of oxides of hollow structure 54a by anodizing, wherein said oxides of hollow structure 54a are material selected from the group consisting of silicon oxide, titanium oxide, zinc oxide, and aluminum oxide and the shape of said oxides of hollow structure 54a are selected from the group consisting of sphere, column, and disk. In order to increase adhesion of said oxides of hollow structure 54a, a plate 54b, transformed from said material layer 53 by anodizing, with a specific thickness is kept. The process continue to the step shown in FIG. 4E, wherein a planarization layer 56, a material selected from the group consisting of polymer, and inorganic material, is formed through spin coating on said porous template layer 54. Finally, as illustrated in FIG. 4F, said buffer layer 57 is formed on said planarization layer 56, wherein said buffer layer 57 is substantially a silicon oxide. The purpose to form said conductive layer 52 is to increase uniformity of said porous template layer 54 and to ensure said material layer 53 to be completely oxidized during anodizing.

In the following explanation, two examples are illustrated to help understand how to form a poly-crystalline silicon thin film transistor on plastic substrate.

Figure 5A:
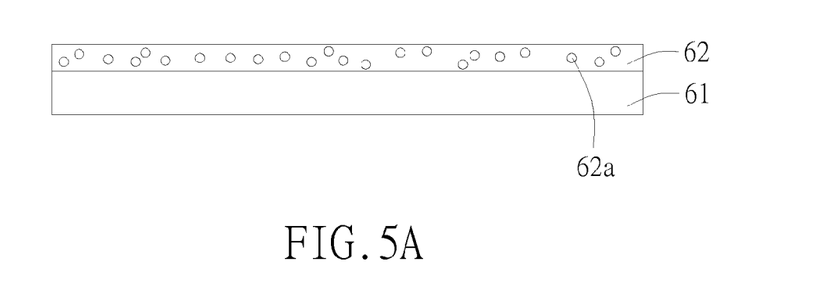
FIG. 5A to FIG. 5F are cross-section views illustrating the flow forming a type of top gate transistor on a structure of thermal resistive layer formed on a plastic substrate.
Figure 5B:
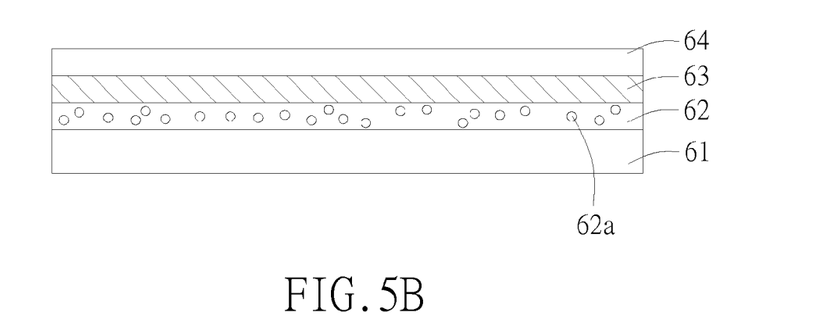
Figure 5C:
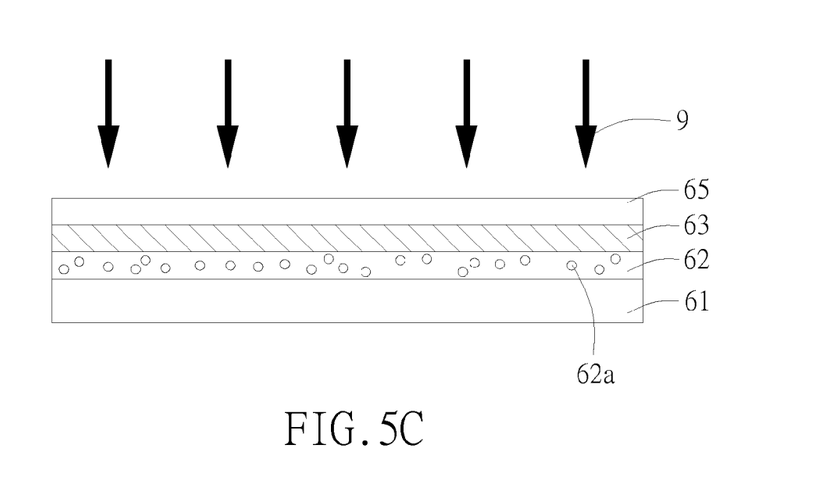

Please referring to FIG. 5A through FIG. 5F, these figures are cross-section views illustrating the flow forming a type of top gate transistor on a structure of thermal resistive layer formed on a plastic substrate. The example illustrates the progress of the flow to form a top gate transistor. As illustrated in FIG. 5A, a porous layer 62, having surface roughness under 5 nanometer and also including a plurality of oxides of hollow structure 62a, is formed on a plastic substrate 61 so as to prevent said plastic substrate 61 from heat damage caused during processing and, on the other hand, to smooth the surface of said plastic substrate 61 so that electronic devices can be manufactured without any problem. Afterwards, as illustrated in FIG. 5B, a buffer layer 63 is formed on said porous layer 62, and then an amorphous silicon layer 64 is formed on said buffer layer 63. Next, as shown in FIG. 5C, said amorphous silicon layer 64 is transformed into polycrystalline silicon layer 65 through the laser annealing 9.

Figure 5D:
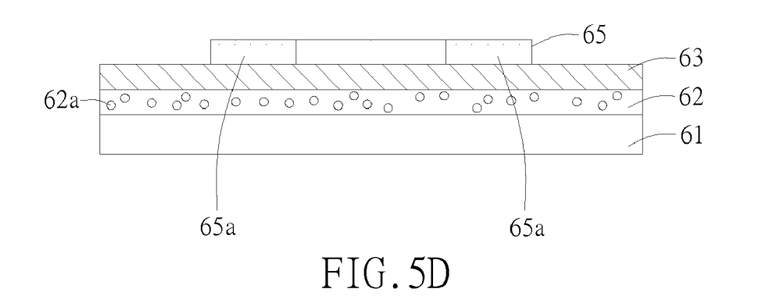
Figure 5E:
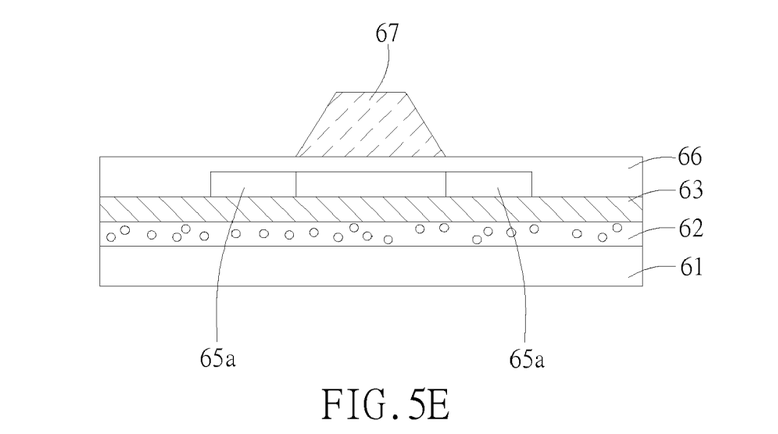
Figure 5F:
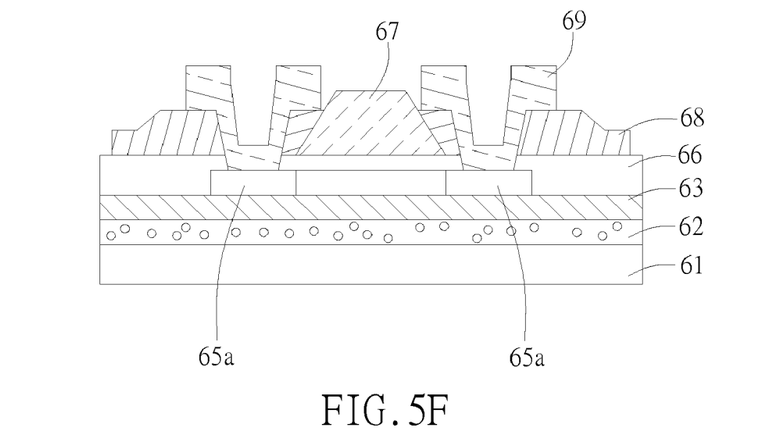

Referring to FIG. 5D, by means of ion implanting, a pair of source/drain region 65a is formed by selecting N-type doped or P-type doped on said poly-crystalline silicon layer 65. Thereafter, as illustrated in FIG. 5E, a gate dielectric layer 66 is deposited and then a gate metal electrode 67 is formed. Afterwards, as shown in FIG. 5F, an interlayer 68 is formed and then contact holes opposite to the said pair of source/drain regions 65a are formed so that metal interconnect 69 can be formed. The purpose of forming said buffer layer 63 is to assist nucleation reaction of silicon seeds to be formed easily on said buffer layer 63 so that forming said amorphous silicon layer 64 would become more smoothly, and to prevent the impurities in the layers formed before said buffer layer 63 from penetrating into said amorphous layer 64.

Figure 6A:
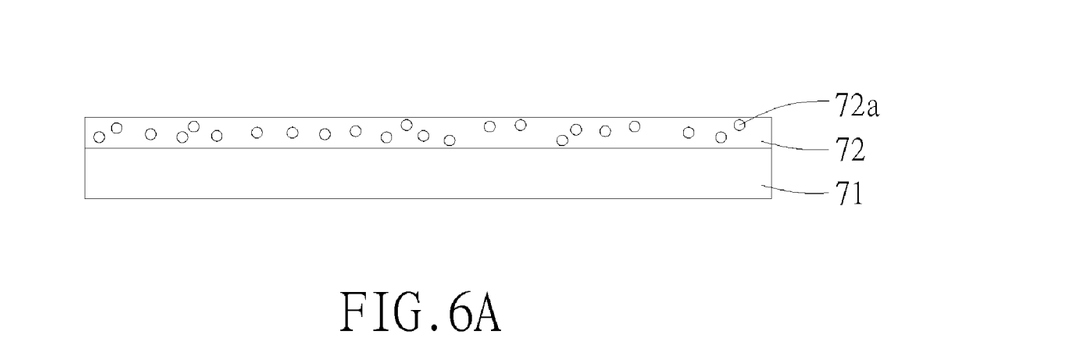
FIG. 6A to FIG. 6F are cross-section views illustrating the flow forming a type of bottom gate transistor on a structure of thermal resistive layer formed on a plastic substrate.
Figure 6B:
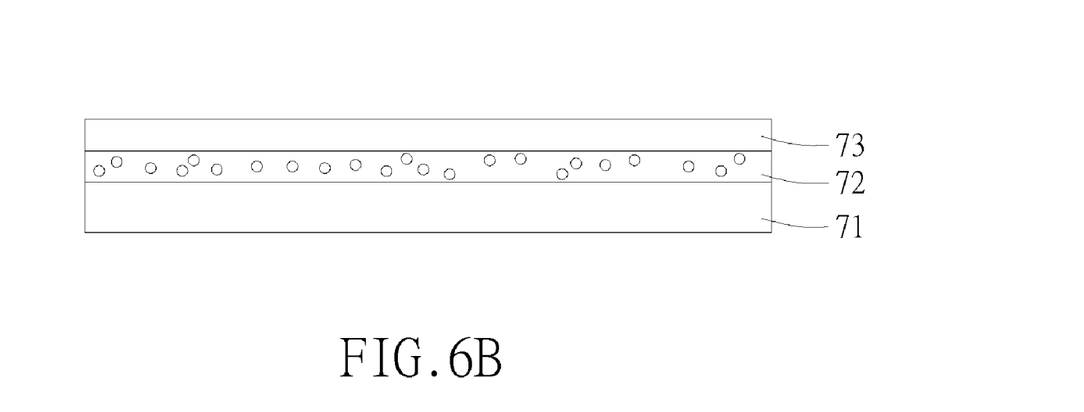

Please referring to FIG. 6A through FIG. 6F, these figures are cross-section views illustrating the flow forming a type of bottom gate transistor on a structure of thermal resistive layer formed on a plastic substrate. The following example illustrated the progress of the flow to form a bottom gate transistor. As illustrated in FIG. 6A, a porous layer 72, having surface roughness under 5 nanometer and also including a plurality of oxides of hollow structure 72a, is formed on a plastic substrate 71 to prevent said plastic substrate 71 from heat damage caused by processing and, on the other hand, to smooth the surface of said plastic substrate 71 so that electric devices can be manufactured without any problem. Afterwards, as illustrated in FIG. 6B, a buffer layer 73 is formed on said porous layer 72.

Figure 6C:
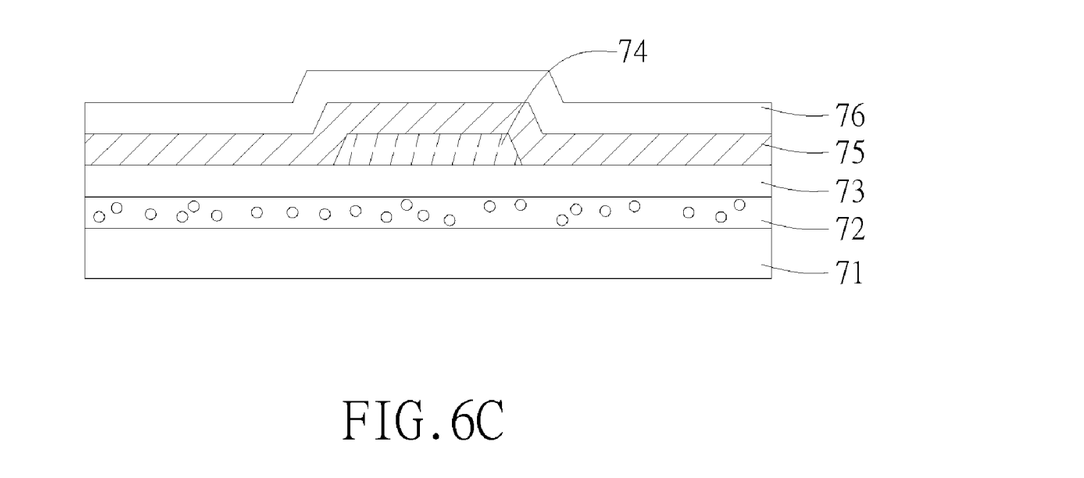
Figure 6D:
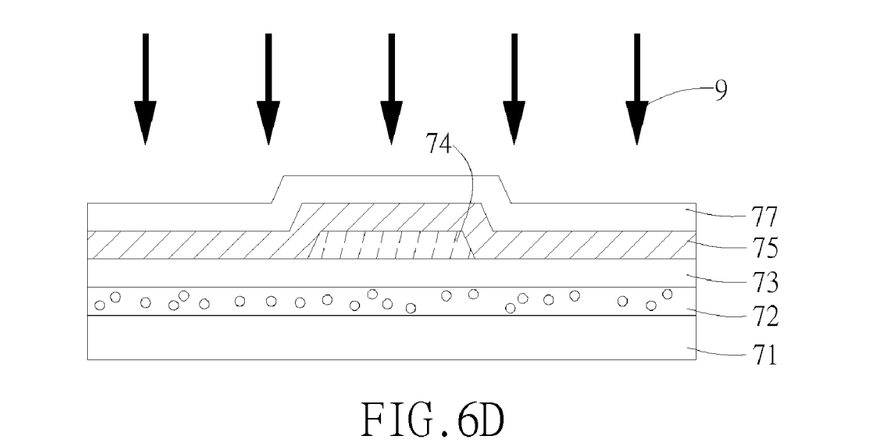
Figure 6E:
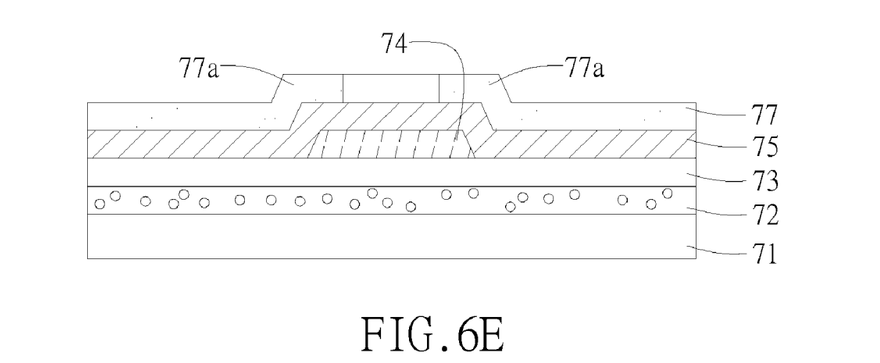
Figure 6F:
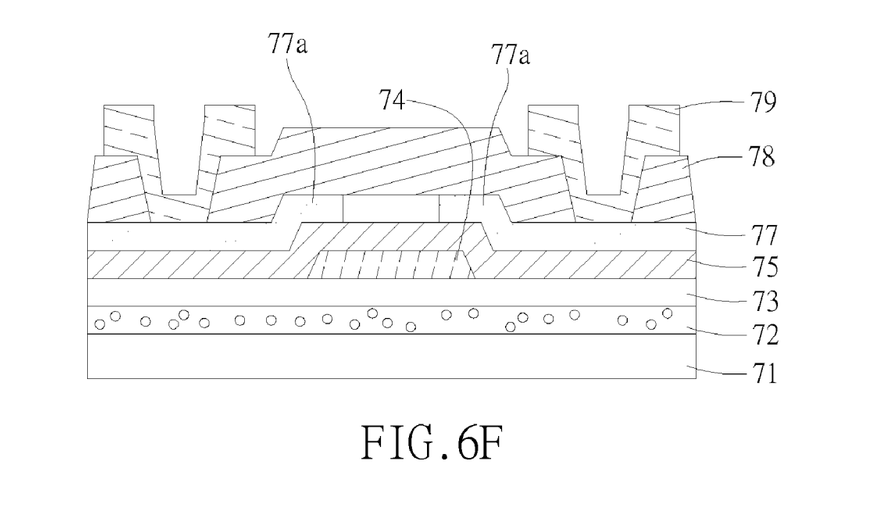

In the next step, as shown in FIG. 6C, a gate metal electrode layer 74 is formed, and then a gate dielectric layer 75 is deposited on said gate metal electrode layer 74. Afterwards an amorphous layer 76 is formed on said gate dielectric layer 75. Referring to FIG. 6D, said amorphous silicon layer 76 is transformed into poly-crystalline silicon layer 77 through the laser annealing 9. Subsequently, as illustrated in FIG. 6E, by means of ion implanting, pair of source/drain regions 77a are formed by selecting N-type doped or P-type doped on said poly-crystalline silicon layer 77. Thereafter, as shown in FIG. 6F, an interlayer 78 is formed subsequently, and then contact holes opposite to the said pair of source/drain regions 77a are formed so that metal interconnect 79 can be formed. The purpose of forming said buffer layer 73 is to assist nucleation reaction of silicon seeds to be formed easily on said buffer layer 73 so that forming said amorphous silicon layer 76 would become more smoothly, and to prevent the impurities in the layers formed before said buffer layer 73 from penetrating into said amorphous layer 76.

While the present invention has been described and illustrated herein with reference to the preferred embodiment thereof, it will be understood by those skilled in the art that various changes in form and details may be made therein without departing from the spirit and the scope of the invention.

What is claimed is:

1. A structure of thermal resistive layer formed on a plastic substrate, comprising:
   a porous layer, formed on said plastic substrate, including a plurality of oxides of hollow structure; and
   a buffer layer, formed on said porous layer;
   a template layer, formed between said plastic substrate and said porous layer, wherein said template layer is a material selected from the group consisting of silicon, titanium, zinc, and aluminum;
   wherein said porous layer protects said plastic substrate from damage caused by the heat generated during manufacturing process.

2. The structure according to claim 1, wherein said oxide of hollow structure is a material selected from the group consisting of silicon oxide, titanium oxide, zinc oxide, and aluminum oxide.

3. The structure according to claim 1, wherein the shape of said oxide of hollow structure is selected from the group consisting of sphere, column, and disk.

4. The structure according to claim 3, wherein the distribution of said oxides of hollow structure in column shape are standing on said plastic substrate.

5. The structure according to claim 3, wherein the distribution of said oxides of hollow structure in column shape are lying flat on said plastic substrate.

6. The structure according to claim 1, further comprising a conductive layer, formed between said plastic substrate and said template layer.

7. The structure according to claim 1, wherein said conductive layer is substantially an indium tin oxide.

8. The structure according to claim 1, further comprising a planarization layer, formed between said porous layer and said buffer layer.

9. The structure according to claim 1, wherein said planarization layer is a material selected from the group consisting of polymer, and inorganic materials.

10. The structure according to claim 1, wherein said buffer layer is substantially a silicon oxide.

11. The structure according to claim 1, further comprising an amorphous layer formed on said buffer layer.

12. The structure according to claim 1, further comprising a polycrystalline silicon layer formed on said buffer layer.

* * * * *